US008948336B2

(12) United States Patent
Qi et al.

(10) Patent No.: US 8,948,336 B2
(45) Date of Patent: Feb. 3, 2015

(54) SHIFT REGISTER AND DRIVING METHOD THEREOF, GATE DRIVING APPARATUS AND DISPLAY APPARATUS

(71) Applicants: BOE Technology Group Co., Ltd., Beijing (CN); Chengdu BOE Optoelectronics Technology Co., Ltd., Chengdu (CN)

(72) Inventors: Xiaojing Qi, Beijing (CN); Bo Wu, Beijing (CN); Wen Tan, Beijing (CN); Young Yik Ko, Beijing (CN)

(73) Assignee: BOE Technology Group., Ltd, Beijing (CN)

( * ) Notice: Subject to any disclaimer, the term of this patent is extended or adjusted under 35 U.S.C. 154(b) by 35 days.

(21) Appl. No.: 13/994,095

(22) PCT Filed: Dec. 17, 2012

(86) PCT No.: PCT/CN2012/086790
§ 371 (c)(1),
(2) Date: Jun. 13, 2013

(87) PCT Pub. No.: WO2013/104235
PCT Pub. Date: Jul. 18, 2013

(65) Prior Publication Data
US 2014/0064437 A1    Mar. 6, 2014

(30) Foreign Application Priority Data
Jan. 13, 2012  (CN) .......................... 2012 1 0010905

(51) Int. Cl.
*G11C 19/00*  (2006.01)
*G11C 19/28*  (2006.01)
*G09G 3/20*  (2006.01)

(52) U.S. Cl.
CPC *G11C 19/28* (2013.01); *G09G 3/20* (2013.01); *G11C 19/287* (2013.01)
USPC .................................. 377/64; 377/69; 377/79

(58) Field of Classification Search
None
See application file for complete search history.

(56) References Cited

U.S. PATENT DOCUMENTS 6,970,530 B1 * 11/2005 Wang et al. ...................... 377/69
7,327,161 B2 * 2/2008 Jang et al. ........................ 326/46
(Continued)

FOREIGN PATENT DOCUMENTS

| CN | 101122720 A | 2/2008 |
| CN | 101546607 A | 9/2009 |

(Continued)

OTHER PUBLICATIONS

Written Opinion of the International Searching Authority dated Mar. 28, 2013 issued by the State Intellectual Property Office of the People's Republic of China in connection with PCT counterpart application, International Application No. PCT/CN2012/086790.

(Continued)

*Primary Examiner* — Tuan T Lam

(57) ABSTRACT

A shift register and driving method thereof, a gate driving apparatus and a display apparatus, the shift register comprises a pulling-up unit(21), a precharging and resetting unit(22), an output signal terminal at present stage(OUTPUT), a pulling-down unit(23), an input terminal connected to an output signal terminal of a shift register at previous stage(OUTF), an input terminal connected to an output signal terminal of a shift register at next stage(OUTL), and a scan control signal input terminal(INPUT), wherein: the precharging and resetting unit(22) precharges a gate of a first thin film transistor(T1) included in the pulling-up unit(21) and resets its potential; the pulling-down unit(23) pulls down a potential at the gate of the first thin film transistor(T1) and the output signal at present stage after the precharging and resetting unit(22) resets the potential at the gate of the first thin film transistor(T1), so that the pulling-up unit(21) is turned off and the output signal at present stage is at a low level. The present shift register realizes a bidirectional gate driving scan from up to down or from down to up by a conversion control for high-low levels of input signals.

7 Claims, 5 Drawing Sheets

(56) References Cited

U.S. PATENT DOCUMENTS

| | | | | |
|---|---|---|---|---|
| 8,023,611 B2* | 9/2011 | Lin et al. | ............................ | 377/64 |
| 8,107,586 B2* | 1/2012 | Shin et al. | ......................... | 377/64 |
| 8,422,621 B2* | 4/2013 | Jang et al. | ......................... | 377/64 |
| 8,571,169 B2* | 10/2013 | Tobita | ............................... | 377/64 |
| 2006/0269038 A1* | 11/2006 | Jang et al. | ......................... | 377/64 |
| 2006/0290390 A1* | 12/2006 | Jang et al. | ....................... | 327/112 |
| 2007/0104307 A1* | 5/2007 | Kim et al. | ......................... | 377/64 |
| 2007/0274433 A1* | 11/2007 | Tobita | .............................. | 377/64 |
| 2008/0036725 A1 | 2/2008 | Lee et al. | | |
| 2008/0048712 A1 | 2/2008 | Ahn et al. | | |
| 2008/0088555 A1 | 4/2008 | Shin et al. | | |
| 2008/0122818 A1* | 5/2008 | Lee | ................................. | 345/204 |
| 2009/0167668 A1* | 7/2009 | Kim | ................................ | 345/100 |
| 2010/0067646 A1* | 3/2010 | Liu et al. | ............................ | 377/69 |
| 2012/0087461 A1* | 4/2012 | Liu et al. | ............................ | 377/69 |
| 2012/0114092 A1* | 5/2012 | Kim | ................................. | 377/69 |
| 2013/0077736 A1* | 3/2013 | Son | .................................. | 377/69 |
| 2013/0148775 A1* | 6/2013 | Shin et al. | ......................... | 377/69 |

FOREIGN PATENT DOCUMENTS

| | | |
|---|---|---|
| CN | 101556833 A | 10/2009 |
| CN | 101645308 A | 2/2010 |
| CN | 102708779 A | 10/2012 |

OTHER PUBLICATIONS

English translation of Written Opinion of the International Searching Authority dated Mar. 28, 2013 issued by the State Intellectual Property Office of the People's Republic of China in connection with PCT counterpart application, International Application No. PCT/CN2012/086790.

English machine translation of Chinese Patent Document No. CN 101556833 A (above).

International Preliminary Report on Patentability dated Jul. 15, 2014 issued by the International Bureau of WIPO in connection with PCT counterpart application, International Application No. PCT/CN2012/086790.

English translation of International Preliminary Report on Patentability dated Jul. 15, 2014 issued by the International Bureau of WIPO in connection with PCT counterpart application, International Application No. PCT/CN2012/086790.

English abstract of CN 102708779 A (listed above), 1 page.
English abstract of CN 101556833 A (listed above), 1 page.
English abstract of CN 101546607 A (listed above), 1 page.
English abstract of CN 101122720 A (listed above), 2 pages.
English abstract of CN 101645308 A (listed above), 1 page.
International Search Report ("ISR") (Chinese language) issued by the International Searching Authority, Jan. 13, 2012, 13 pages.
First Office Action (Chinese language), issued by SIPO Mar. 28, 2013, 4 pages.
English translation of First Office Action (listed above), 3 pages.
Rejection Decision (Chinese language), issued by SIPO Oct. 8, 2013, 4 pages.
English translation of Rejection Decision (listed above), 1 page.

* cited by examiner

US 8,948,336 B2

SHIFT REGISTER AND DRIVING METHOD THEREOF, GATE DRIVING APPARATUS AND DISPLAY APPARATUS

CROSS REFERENCE TO RELATED APPLICATIONS

This application is based on International Application No. PCT/CN2012/086790 filed on Dec. 17, 2012, which claims priority to Chinese Application No. 201210010905.8 filed on Jan. 13, 2012 the contents of which are incorporated herein by reference.

FIELD OF THE INVENTION

The present disclosure relates to a field of display technique, and in particular, to a shift register and driving method thereof, a gate driving apparatus and a display apparatus, which adopt a GOA (Gate Driver On Array) technique.

BACKGROUND

In a TFT-LCD, a basic principle for displaying pictures in each frame is as follows: a source driver outputs signals required by pixels in each row sequentially from up to down, while a gate driver strobes the pixels in each row by inputting a square wave having a certain width to the pixels in each row sequentially from up to down. FIG. 1 shows a circuit diagram of a shift register applied to a gate driving apparatus in a liquid crystal display in the prior art.

As illustrated in FIG. 1, the shift register applied to the gate driving apparatus in a liquid crystal display in the prior art comprises a pre-charging unit T1, a pulling-up unit T3, a resetting unit T2 and a pulling-down unit T4. A node P (a node connected with a source of the T1) is connected with a clock signal CLK1 via a capacitor C1, a drain of the T3 is connected with a clock signal CLK2, and the node P is connected to a source of T3 via a capacitor C2, wherein Voff is a 0 potential or a low potential (for example, a GND or a power supply VSS). When an output signal of a shift register at previous stage, that is, an input signal Input(n) of the shift register at present stage, is at a high level, the T1 precharges the Node P (the node connected with the source of the T1); the T3 makes an output signal Row(n) of the shift register at present stage is at a high level in accordance with a timing sequence of the CLK2; when an output signal of the shift register at next stage, that is, a resetting signal Reset(n) of the shift register at present stage, is at a high level, the T2 resets a control terminal of the T3, the T4 resets the output signal Row(n) of the shift register at present stage. When the output signal of the shift register at next stage, that is, the resetting signal Reset(n) of the shift register at present stage, is at a low level, the control terminal and the output terminal of the T3 are floating, which results in the output signal of the shift register at present stage unstable.

Moreover, a gate driving IC and a source driving IC are bound on a glass panel by a COG (Chip on Glass) process in the existing manufacture method. However, in a TFT-LCD having a small size, the numbers of the outputs of the gate driving and the source driving are relatively large when a resolution is higher, such that a length of the driving IC is increased, which is disadvantageous for a binding process of the driving IC modules.

SUMMARY

Embodiments of the present disclosure provide a shift register and driving method thereof, a gate driving apparatus and a display apparatus, which may realize a bidirectional scanning for the gate driving from up to down or from down to up by a conversion control for high-low levels of an input signal.

On one aspect, the embodiments of the present disclosure provide a shift register comprising a pulling-up unit, a precharging and resetting unit, a pulling-down unit and an output signal terminal at present stage, wherein:

the pulling-up unit comprises a first thin film transistor and a pulling-up capacitor connected between a gate and a source of the first thin film transistor in parallel, is connected with the output signal terminal at present stage and is used for pulling up an output signal at present stage so that the output signal at present stage is at a high level;

the precharging and resetting unit is connected with the gate of the first thin film transistor, an input terminal connected to an output signal of a shift register at previous stage, an input terminal connected to an output signal of a shift register at next stage and a scan control signal input terminal, respectively, and is used for precharging the pulling-up capacitor under controls of a scan control signal and the output signal of the shift register at previous stage before the pulling-up unit pulls up the output signal at present stage so that the first thin film transistor is turned on, and for resetting a potential at the gate of the first thin film transistor under controls of the scan control signal and the output signal of the shift register at next stage after the pulling-up unit pulls up the output signal at present stage so that the output signal at present stage is at a low level;

the pulling-down unit is connected with the gate of the first thin film transistor and the output signal terminal at present stage, respectively, and is used for pulling down a potential at the gate of the first thin film transistor and the output signal at present stage after the precharging and resetting unit resets the potential at the gate of the first thin film transistor, so that the pulling-up unit is turned off and the output signal at present stage is at the low level.

In an implementation, a drain of the first thin film transistor is connected with a first clock signal input terminal, the source thereof is connected with the output signal terminal at present stage, and the gate thereof is connected with the scan signal input terminal via the precharging and resetting unit;

the precharging and resetting unit comprises a second thin film transistor and a third thin film transistor;

a gate of the second thin film transistor is connected with the input terminal connected to the output signal at previous stage, a drain thereof is connected with the scan control signal input terminal, and a source thereof is connected with the gate of the first thin film transistor;

a gate of the third thin film transistor is connected with the input terminal connected to the output signal at next stage, a drain thereof is connected with the gate of the first thin film transistor, and a source thereof is connected with the scan control signal input terminal.

In an implementation, the pulling-down unit comprises a dual pulling-down module and a dual pulling-down control module, wherein, the dual pulling-down module is connected with the dual pulling-down control module, the output signal terminal at present stage and the gate of the first thin film transistor, respectively, and is used for pulling-down the output signal at present stage and the potential at the gate of the first thin film transistor alternatively under a control of the dual pulling-down control module.

In an implementation, the dual pulling-down module comprises a fourth thin film transistor, a fifth thin film transistor and a sixth thin film transistor;

the dual pulling-down control module comprises an inverter including a seventh thin film transistor, an eighth thin film transistor, a ninth thin film transistor and a tenth thin film transistor;

the dual pulling-down control module is connected with the first clock signal input terminal, and the dual pulling-down module is connected with a second clock signal input terminal;

a gate of the fourth thin film transistor is connected with a gate of the fifth thin film transistor, a drain of the eighth thin film transistor and a source of the tenth thin film transistor, respectively, a source thereof is connected with a power supply VSS, and a drain thereof is connected with the gate of the first thin film transistor, a gate of the seventh thin film transistor, the source of the second thin film transistor and the drain of the third thin film transistor, respectively.

a source of the fifth thin film transistor is connected with the power supply VSS, and a drain thereof is connected with the output signal terminal at present stage;

a gate of the sixth thin film transistor is connected with the second clock signal input terminal, and a drain thereof is connected with the output signal terminal at present stage;

a gate of the seventh thin film transistor is connected with the gate of the first thin film transistor, a source thereof is connected with the power supply VSS, and a drain thereof is connected with a source of the ninth thin film transistor and a gate of the tenth thin film transistor, respectively;

a gate of the eighth thin film transistor is connected with the gate of the first thin film transistor, a source thereof is connected with the power supply VSS, and a drain thereof is connected with a source of the tenth thin film transistor;

a gate and a drain of the ninth thin film transistor are connected with the first clock signal input terminal, and a source thereof is connected with a gate of the tenth thin film transistor; and a drain of the tenth thin film transistor is connected with the first clock signal input terminal.

In an implementation, the shift register according to the embodiment of the present disclosure further comprises a pulling-down and resetting unit;

the pulling-down and resetting unit is connected with the input terminal connected to the output signal of the shift register at previous stage and the input terminal connected to the output signal of the shift register at next stage, respectively, and is used for pulling down and resetting the output signal at present stage under controls of the output signal of the shift register at previous stage and the output signal of the shift register at next stage.

In an implementation, the pulling-down and resetting unit comprises an eleventh thin film transistor and a twelfth thin film transistor;

a source of the eleventh thin film transistor is connected with the power supply VSS, a drain thereof is connected with the output signal terminal at present stage, and a gate thereof is connected with the input terminal connected to the output signal of the shift register at next stage;

a source of the twelfth thin film transistor is connected with the power supply VSS, a drain thereof is connected with the output signal terminal at present stage, and a gate thereof is connected with the input terminal connected to the output signal of the shift register at previous stage;

the eleventh thin film transistor pulls down the output signal at present stage when the output signal of the shift register at next stage is at a high level;

the twelfth thin film transistor pulls down the output signal at present stage when the output signal of the shift register at previous stage is at a high level.

The embodiments of the present disclosure further provide a driving method applied to the above-described shift register, the driving method of the shift register comprising:

a precharging step: precharging a pulling-up capacitor included in a pulling-up unit by a precharging and resetting unit, so that a first thin film transistor included in the pulling-up unit is turned on;

a pulling-up step: pulling up an output signal of the shift register at present stage by the pulling-up unit, so that the output signal of the shift register at present stage is at a high level;

a resetting step: resetting a potential at a gate of the first thin film transistor by the precharging and resetting unit, so that the output signal at present stage is at a low level; and a pulling-down step: pulling down the potential at the gate of the first thin film transistor and the output signal at present stage, so that the pulling-up unit is turned off and the output signal at present stage is at a low level.

The embodiments of the present disclosure further provide a gate driving apparatus comprising a plurality of stages of the above-described shift registers manufactured on an array substrate of a liquid crystal display by an array film process;

Except the shift register at a first stage, an input terminal of each of the remaining shift registers, which is connected to an output signal of a shift register at previous stage, is connected with an output signal terminal of a shift register at previous stage adjacent to the present shift register;

except the shift register at a last stage, an input terminal of each of the remaining shift registers, which is connected to an output signal of a shift register at next stage, is connected with an output signal terminal of a shift register at next stage adjacent to the present shift register;

both of an input terminal of the shift register at the first stage, which is connected to an output signal of a shift register at previous stage, and an input terminal of the shift register at the last stage, which is connected to an output signal of a shift register at next stage, are connected with a start signal.

In an implementation, a scan control signal input terminal of the shift register at the (2M-1)th stage and a scan control signal input terminal of the shift register at the 2Mth stage are connected with a STV, when M is an odd number; the scan control signal input terminal of the shift register at the (2M-1)th stage and the scan control signal input terminal of the shift register at the 2Mth stage are connected with a STVB, when M is an even number; wherein M is a positive integer being smaller than or equal to a value obtained by dividing the number of the shift registers by 2;

the STV and the STVB are dual cycle complementary clock signals.

The embodiments of the present disclosure further provide a display apparatus comprising the above-described gate driving apparatus.

As compared with the prior art, the shift register and driving method thereof, the gate driving apparatus and the display apparatus according to the embodiments of the present disclosure may realize a bidirectional gate driving scan from up to down or from down to up by a conversion control for high-low levels of input signals.

DETAILED DESCRIPTION

Figure 1:
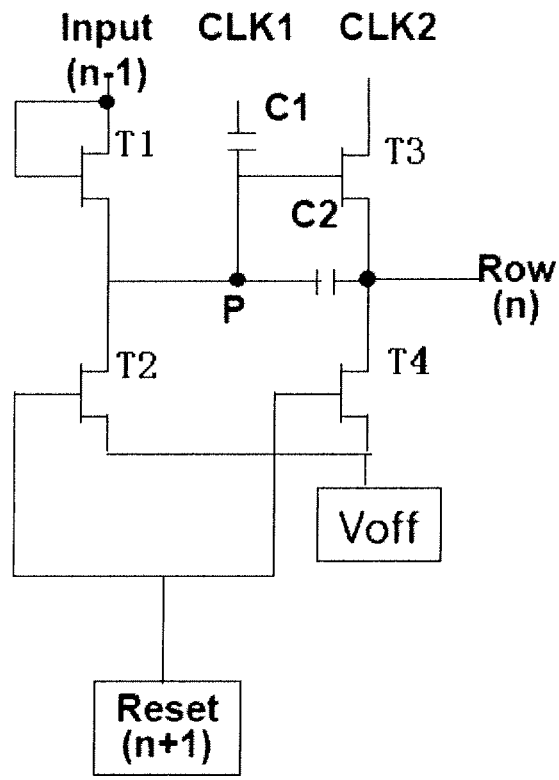
FIG. 1 is a circuit diagram of a shift register applied to a gate driving apparatus in a liquid crystal display in the prior art.
Figure 2:
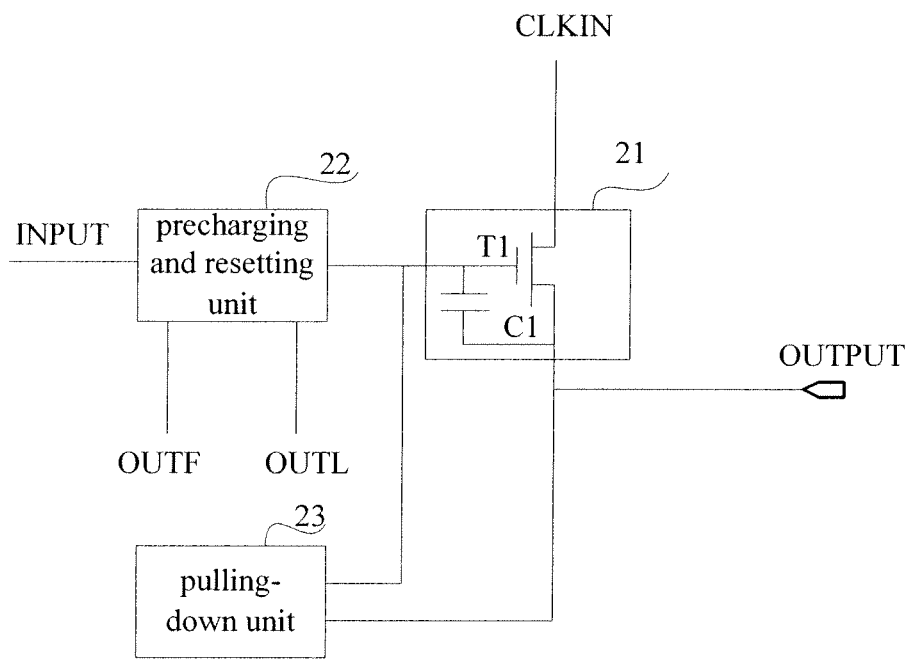
FIG. 2 is a circuit diagram illustrating an embodiment of the shift register according to the present disclosure.

As illustrated in FIG. 2, the shift register according to the first embodiment of the present disclosure comprises a pulling-up unit 21, a precharging and resetting unit 22, a pulling-down unit 23 and an output signal terminal OUTPUT at present stage, wherein:

the pulling-up unit 21 comprising a first thin film transistor T1 and a pulling-up capacitor C1, is used for pulling up an output signal at present stage so that the output signal at present stage is at a high level, in order to output a high level signal for gate driving; a drain of the first thin film transistor T1 is connected with a first clock signal input terminal CLKIN, the source thereof is connected with the output signal terminal OUTPUT at present stage, and the gate thereof is connected with a scan signal input terminal INPUT via the precharging and resetting unit 22; and the pulling-up capacitor C1 is connected between the gate and the source of the first thin film transistor T1 in parallel;

the precharging and resetting unit 22 is connected with the gate of the first thin film transistor T1, an input terminal OUTF connected to an output signal of a shift register at previous stage, an input terminal OUTL connected to an output signal of a shift register at next stage, and the scan control signal input terminal INPUT, respectively, and is used for precharging the pulling-up capacitor C1 under controls of a scan control signal and the output signal of the shift register at previous stage before the pulling-up unit 21 pulls up the output signal at present stage, so that the first thin film transistor T1 is turned on; and is used for resetting a potential at the gate of the first thin film transistor T1 under controls of the scan control signal and the output signal of the shift register at next stage after the pulling-up unit 21 pulls up the output signal at present stage, so that the output signal at present stage is at a low level;

the pulling-down unit 23 is connected with the gate of the first thin film transistor T1 and the output signal terminal OUTPUT at present stage, respectively, and is used for pulling down a potential at the gate of the first thin film transistor T1 and the output signal at present stage after the precharging and resetting unit 22 resets the potential at the gate of the first thin film transistor T1, so that the pulling-up unit 21 is turned off and the output signal at present stage is at a low level.

Figure 3:
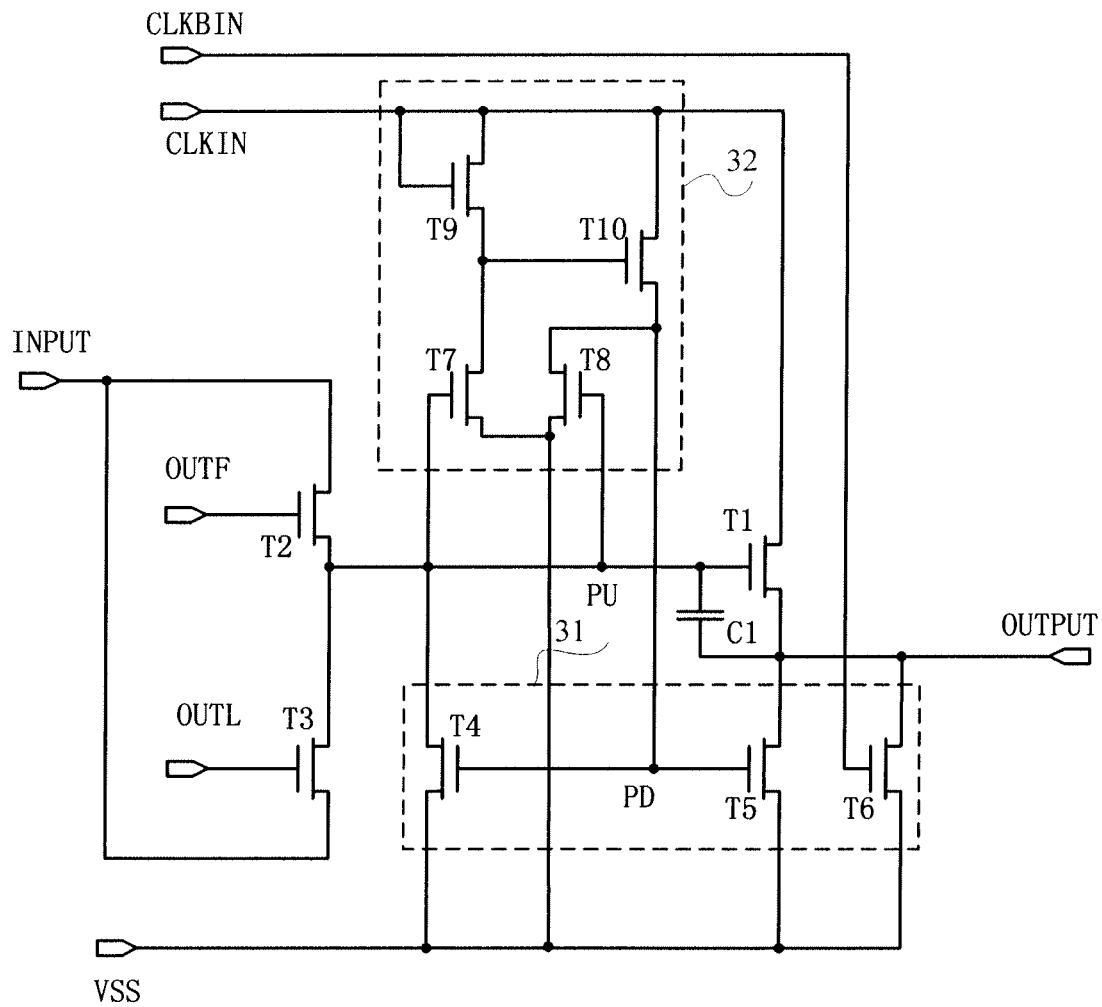
FIG. 3 is a circuit diagram illustrating another embodiment of the shift register according to the present disclosure.

As illustrated in FIG. 3, the shift register according to the second embodiment of the present disclosure comprises a pulling-up unit, a precharging and resetting unit, a pulling-down unit and an output signal terminal at present stage, wherein, the pulling-down unit comprises a dual pulling-down module 31 and a dual pulling-down control module 32, wherein, the dual pulling-down control module 32 is used for controlling the dual pulling-down module 31 to operate under controls of dual clock CLK and CLKB and a Node PU (that is, a node connected with the gate of the first thin film transistor T1);

the dual pulling-down module 31 is connected with the dual pulling-down control module 32, the output signal terminal OUTPUT at present stage and the gate of the first thin film transistor T1, respectively, and is used for pulling-down the output signal at present stage and the potential at the gate of the first thin film transistor T1 alternatively under a control of the dual pulling-down control module 32;

the pulling-up unit comprises the first thin film transistor T1 and the pulling-up capacitor C1, and the pulling-up capacitor C1 is connected between the gate and the source of the first thin film transistor T1 in parallel;

the precharging and resetting unit comprises a second thin film transistor T2 and a third thin film transistor T3;

a gate of the second thin film transistor T2 is connected with the input terminal OUTF connected to the output signal at previous stage, a drain thereof is connected with the scan control signal input terminal INPUT, and a source thereof is connected with the gate of the first thin film transistor T1;

a gate of the third thin film transistor T3 is connected with the input terminal OUTL connected to the output signal at next stage, a drain thereof is connected with the gate of the first thin film transistor T1, and a source thereof is connected with the scan control signal input terminal INPUT;

the dual pulling-down module 31 comprises a fourth thin film transistor T4, a fifth thin film transistor T5 and a sixth thin film transistor T6;

the dual pulling-down control module 32 comprises an inverter including a seventh thin film transistor T7, an eighth thin film transistor T8, a ninth thin film transistor T9 and a tenth thin film transistor T10;

a gate of the fourth thin film transistor T4 is connected with a gate of the fifth thin film transistor T5, a drain of the eighth thin film transistor T8 and a source of the tenth thin film transistor T10, respectively, a source thereof is connected with a power supply VSS, and a drain thereof is connected with the gate of the first thin film transistor T1, a gate of the seventh thin film transistor T7, the source of the second thin film transistor T2 and the drain of the third thin film transistor T3, respectively.

a source of the fifth thin film transistor T5 is connected with the power supply VSS, and a drain thereof is connected with the output signal terminal OUTPUT at present stage;

a gate of the sixth thin film transistor T6 is connected with the second clock signal input terminal CLKBIN, and a drain thereof is connected with the output signal terminal OUTPUT at present stage;

a gate of the seventh thin film transistor T7 is connected with the gate of the first thin film transistor T1, a source thereof is connected with the power supply VSS, and a drain thereof is connected with a source of the ninth thin film transistor T9 and a gate of the tenth thin film transistor T10, respectively;

a gate of the eighth thin film transistor T8 is connected with the gate of the first thin film transistor T1, a source thereof is connected with the power supply VSS, and a drain thereof is connected with a source of the tenth thin film transistor T10;

a gate and a drain of the ninth thin film transistor T9 are connected with the first clock signal input terminal CLKIN, and a source thereof is connected with a gate of the tenth thin film transistor T10; and a drain of the tenth thin film transistor T10 is connected with the first clock signal input terminal.

In this embodiment, when a scanning for a gate driving is performed from up to down, the T2 serves as a precharging part, and the T3 serves as a resetting part; and when the scanning for the gate driving is performed from down to up, the T3 serves as the precharging part, and the T2 serves as the resetting part. The precharging part is used for precharging the pulling-up capacitor C1 within half of a clock cycle during which the CLKB is at a high level; and the resetting part resets a potential at a Node PU (a node connected with the gate of the T1) after the shift register at present stage outputs a gate driving square wave.

In this embodiment, the T7, T8, T9 and T10 constitute an inverter, so that voltages at a Node PD (a node connected with the gate of the T5) and the Node PU (the node connected with the gate of the T1) are converted rapidly, which may has a perfect control effect for a low temperature.

In this embodiment, the T5 and T6 pulls down the output signal at present stage alternatively, which may prevent the output of the shift register from being floating.

In this embodiment, the first clock signal CLK is input through the first clock signal input terminal CLKIN; the second clock signal CLKB is input through the second clock signal input terminal CLKBIN; the first clock signal CLK and the second clock signal CLKB are single cycle clock signals input differentially; the scan control signal is input through the scan control signal input terminal INPUT and may be a STV or a STVB, wherein the STV and the STVB are dual cycle complementary signals, and their high levels and low levels are switched when forward/backward scan is performed; the output signal of the shift register at present stage is the gate driving signal of the liquid crystal display.

Figure 4:
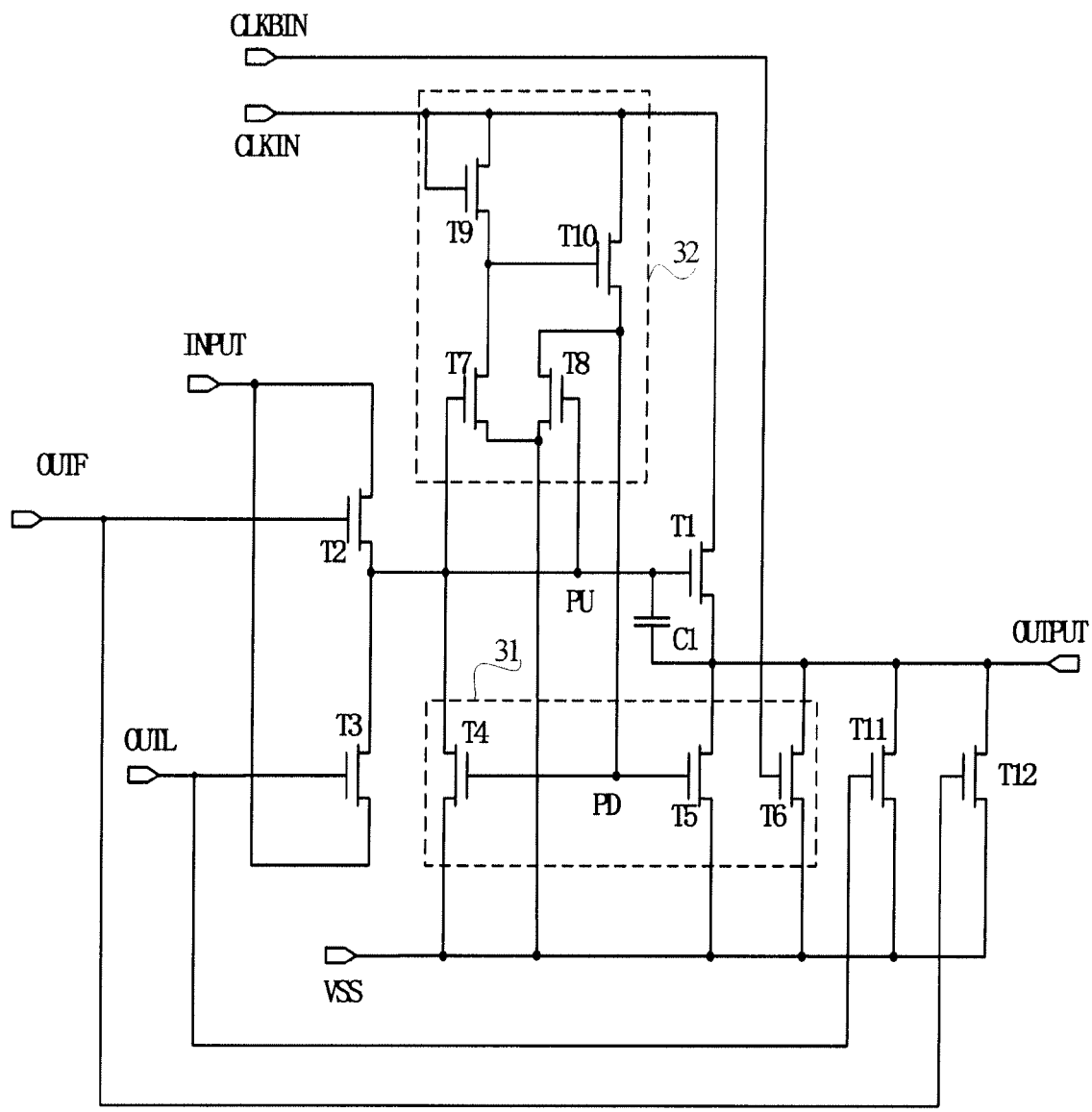
FIG. 4 is a circuit diagram illustrating a still embodiment of the shift register according to the present disclosure.

As illustrated in FIG. 4, the shift register according to another embodiment of the present disclosure further comprises a pulling-down and resetting unit;

the pulling-down and resetting unit is connected with an input terminal OUTF connected to the output signal of the shift register at previous stage and an input terminal OUTL connected to the output signal of the shift register at next stage, respectively, and is used for pulling-down and resetting the output signal of the shift register at present stage under controls of the output signal of the shift register at previous stage and the output signal of the shift register at next stage.

The pulling-down and resetting unit comprises an eleventh thin film transistor T11 and a twelfth thin film transistor T12;

a source of the eleventh thin film transistor T11 is connected with the power supply VSS, a drain thereof is connected with the output signal terminal OUTPUT at present stage, and a gate thereof is connected with the input terminal OUTL connected to the output signal of the shift register at next stage;

a source of the twelfth thin film transistor T12 is connected with the power supply VSS, a drain thereof is connected with the output signal terminal OUTPUT at present stage, and a gate thereof is connected with the input terminal OUTF connected to the output signal of the shift register at previous stage.

The eleventh thin film transistor T11 pulls down the output signal at present stage when the output signal of the shift register at next stage is at a high level;

the twelfth thin film transistor T12 pulls down the output signal at present stage when the output signal of the shift register at previous stage is at a high level.

In this embodiment, the pulling-down and resetting unit may realize the pulling-down and resetting for the output of the shift register better, and reduce a falling time.

The present disclosure further provide a driving method of a shift register, applied to the above-described shift register, the driving method of the shift register comprising:

a precharging step: precharging a pulling-up capacitor included in a pulling-up unit by a precharging and resetting unit, so that a first thin film transistor included in the pulling-up unit is turned on;

a pulling-up step: pulling up an output signal of the shift register at present stage by the pulling-up unit, so that the output signal of the shift register at present stage is at a high level;

a resetting step: resetting a potential at a gate of the first thin film transistor by the precharging and resetting unit, so that the output signal at present stage is at a low level;

a pulling-down step: pulling down the potential at the gate of the first thin film transistor and the output signal at present stage, so that the pulling-up unit is turned off and the output signal at present stage is at a low level.

Figure 5A:
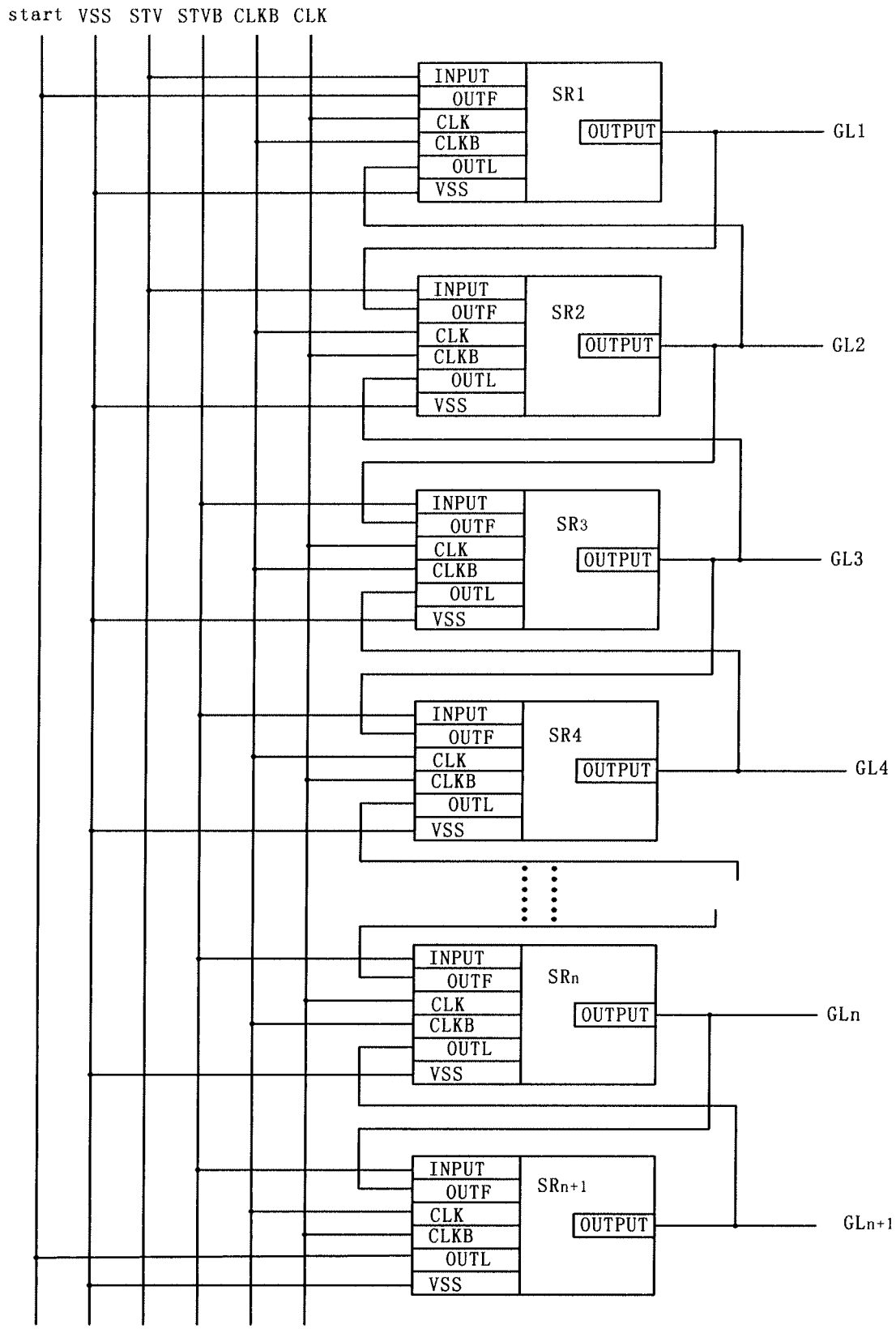
FIG. 5A is a circuit diagram illustrating an embodiment of the gate driving apparatus according to the present disclosure.

A circuit diagram of an embodiment of the gate driving apparatus in the liquid crystal display according to the present disclosure is as illustrated in FIG. 5A. The gate driving apparatus in the liquid crystal display of this embodiment comprises a plurality of stages of the above-described shift registers manufactured on an array substrate of a liquid crystal display by an array film process.

Except the shift register at a first stage, the input terminal OUTF of each of the remaining shift registers, which is connected to the output signal of the shift register at previous stage, is connected with the output signal terminal OUTPUT of the shift register at previous stage adjacent to the present shift register;

except the shift register at a last stage, the input terminal OUTL of each of the remaining shift registers, which is connected to the output signal of the shift register at next stage, is connected with the output signal terminal OUTPUT of the shift register at next stage adjacent to the present shift register.

Both of the input terminal OUTF of the shift register at the first stage, which is connected to the output signal of the shift register at previous stage, and the input terminal OUTL of the shift register at the last stage, which is connected to the output signal of the shift register at next stage, are connected with a start signal "start". In this embodiment, the scan control signal input terminal of the shift register $SR_1$ at the first stage and the scan control signal input terminal of the shift register $SR_2$ at the second stage are connected with the STV, while the scan control signal input terminal of the shift register $SR_3$ at the third stage and the scan control signal input terminal of the shift register $SR_4$ at the fourth stage are connected with the STVB, and so on; that is, the scan control signal input terminal of the shift register at the (2M-1)th stage and the scan control signal input terminal of the shift register at the 2Mth stage are connected with the STV, when M is an odd number; while the scan control signal input terminal of the shift register at the (2M-1)th stage and the scan control signal input terminal of the shift register at the 2Mth stage are connected with the STVB, when M is an even number; wherein M is a positive integer being smaller than or equal to a value obtained by dividing the number of the shift registers by 2; the STV and the STVB are dual cycle complementary clock signals, and their high level and low level are switched when forward/backward scan is performed. In this embodiment, the gate d Fig. driving apparatus in the liquid crystal display performs the bidirectional scan according to the high-low level transitions of the STV/STVB, CLK/CLKB.

In FIG. 5A, $GL_1$ is a first gate driving signal, $GL_2$ is a second gate driving signal, $GL_3$ is a third gate driving signal, $GL_4$ is a fourth gate driving signal, and $GL_n$ is an nth gate driving signal, wherein n is a positive integer.

Figure 5B:
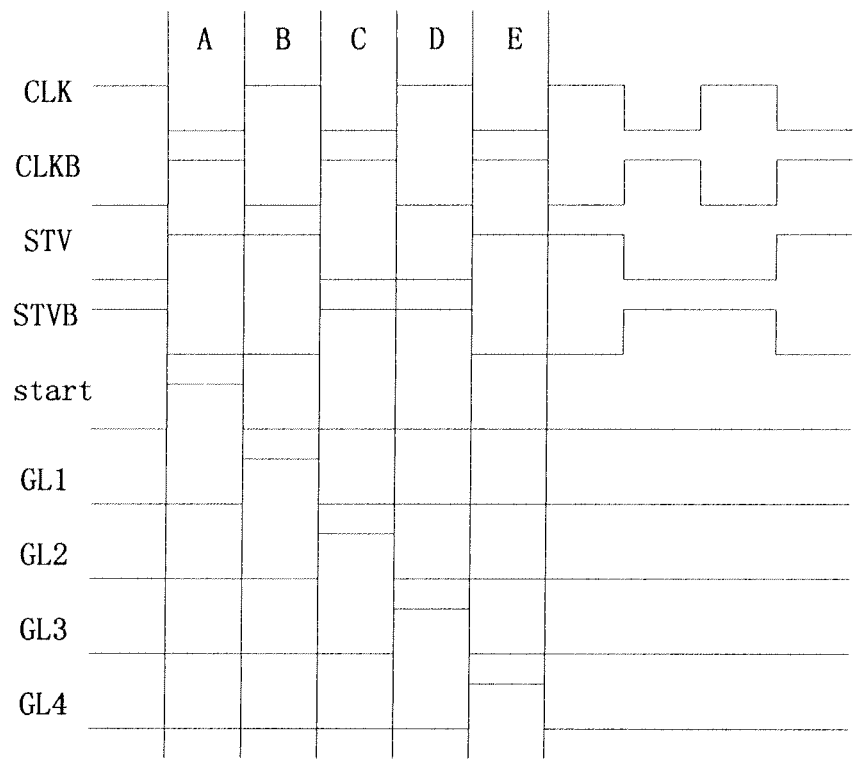
FIG. 5B is a timing sequence diagram illustrating signals when the gate driving apparatus scans from up to down according to the present disclosure.

Thereafter, an operation principle of the gate driving apparatus in the bidirectional scanning liquid crystal display according to the present disclosure will be explained, in connection with the circuit diagram of an embodiment of the shift register according to the present disclosure illustrated in FIG. 3, the circuit diagram of an embodiment of the gate driving apparatus in the bidirectional scanning liquid crystal display according to the present disclosure illustrated in FIG. 5A and a timing sequence diagram for signals when the gate driving apparatus in the liquid crystal display scans from up to down according to the present disclosure illustrated in FIG. 5B. When the scanning is performed from up to down, the T2 serves as the precharging part and the T3 serves as the resetting part.

In Stage A: the STV is at a high level, the CLK is at a low level, the CLKB is at a high level, the start is at a high level; the start is input to the OUTF of $SR_1$ so as to turn on the T2, the STV precharges the gate (that is, the Node PU) of the T1 in the $SR_1$, so that a voltage at the Node PU rises; the dual pulling-down module makes a voltage at the Node PD (that is, the gate of the fifth thin film transistor T5) be low, and both of the T4 and T5 are turned off, the Node PU remains a precharging state, the CLKB sets the $SR_1$ to a low level, the T3 is turned off.

In Stage B, after precharging, the CLK is at a high level, the CLKB is at a low level, the start is at a low level, the $GL_2$ is at a low level, the T2, T3, T6 in the $SR_1$ are turned off; the potential at the Node PU in the $SR_1$ rises, the T1 is turned on, the output signal at present stage is pulled up, the $GL_1$ output a high level signal, which is shifted from the start signal; meantime, the $GL_1$ is input to the OUTF in $SR_2$, so that the T2 is turned on and the STV precharges the Node PU in the $SR_2$, which makes the voltage at the Node PU rise.

In Stage C: the potential at the Node PU in the $SR_2$ rises, the T1 is turned on, the output signal at present stage is pulled up, the $GL_2$ outputs a high level signal, which is shifted from the $GL_1$; the $GL_2$ is input to the OUTL in the $SR_1$, the STV is at a low level, the CLK is at a low level, the CLKB is at a high level, the T1, T2 are turned off, the T3, T6 are turned on, the dual pulling-down control module makes the Node PD at a low level, the Node PU in the $SR_1$ and the $GL_1$ are set to a low level; meantime, the $GL_2$ is input to the OUTF in $SR_3$, so that the T2 is turned on and the STVB precharges the Node PU in the $SR_3$, which makes the voltage at the Node PU rise.

In Stage D: the potential at the Node PU in the $SR_3$ rises, the T1 is turned on, the output signal at present stage is pulled up, the $GL_3$ outputs a high level signal, which is shifted from the $GL_2$; the $GL_3$ is input to the OUTL in the $SR_2$, the Node PU in the $SR_2$ and the $GL_2$ are set to the low level; meantime, the $GL_3$ is input to the OUTF in $SR_4$, so that the T2 is turned on and the STVB precharges the Node PU in the $SR_4$, which makes the voltage at the Node PU rise.

In Stage E: the potential at the Node PU in the $SR_4$ rises, the T1 is turned on, the output signal at present stage is pulled up, the $GL_4$ outputs a high level signal, which is shifted from the $GL_3$; the $GL_4$ is input to the OUTL in the $SR_5$.

Thus the gate driving apparatus in the liquid crystal display may scan from up to down, that is, realize a gate driving scan output from up to down under the controls of the high-low levels of the STV/STVB, CLK/CLKB.

Figure 5C:
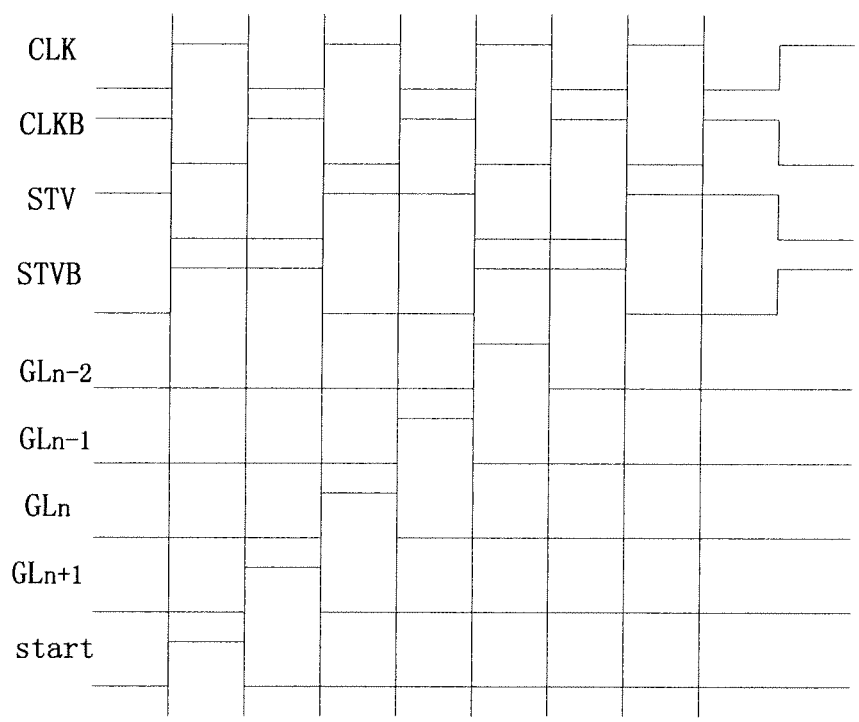
FIG. 5C is a timing sequence diagram illustrating signals when the gate driving apparatus scans from down to up according to the present disclosure.

FIG. 5C is a timing sequence diagram for signals when the gate driving apparatus in the liquid crystal display scans from down to up according to the present disclosure. As compared with the timing sequence diagram for signals when the gate driving apparatus in the liquid crystal display scans from up to down according to the present disclosure shown in FIG. 5B, it is realized by converting the high level and low level of the CLK and CLKB, STV and STVB. When the gate driving apparatus in the liquid crystal display according to the present disclosure scans from down to up, the T3 serves as the precharging part and the T2 serves as the resetting part.

The present disclosure further provides a display apparatus comprising the above-described gate driving apparatus.

The above are only exemplary embodiments of the disclosure, but the scope sought for protection is not limited thereto. Instead, any or all modifications or replacements as would be obvious to those skilled in the art are intended to be included within the scope of the present invention. Therefore, the scope of the present invention is defined in the appended claims.

What is claimed is:

1. A shift register, comprising a pulling-up unit, a precharging and resetting unit, a pulling-down unit and an output signal terminal at present stage, wherein:

the pulling-up unit comprises a first thin film transistor and a pulling-up capacitor connected between a gate and a source of the first thin film transistor in parallel, and the pulling-up unit is connected with the output signal terminal at present stage and is used for pulling up an output signal at present stage so that the output signal at present stage is at a high level;

the precharging and resetting unit is connected with the gate of the first thin film transistor, an input terminal connected to an output signal of a shift register at previous stage, an input terminal connected to an output signal of a shift register at next stage and a scan control signal input terminal, respectively, and is used for precharging the pulling-up capacitor under controls of a scan control signal and the output signal of the shift register at previous stage before the pulling-up unit pulls up the output signal at present stage so that the first thin film transistor is turned on, and for resetting a potential at the gate of the first thin film transistor under controls of the scan control signal and the output signal of the shift register at next stage after the pulling-up unit pulls up the output signal at present stage so that the output signal at present stage is at a low level;

the pulling-down unit is connected with the gate of the first thin film transistor and the output signal terminal at present stage, respectively, and is used for pulling down a potential at the gate of the first thin film transistor and the output signal at present stage after the precharging and resetting unit resets the potential at the gate of the first thin film transistor, so that the pulling-up unit is turned off and the output signal at present stage is at the low level;

the pulling-down unit comprises a dual pulling-down module and a dual pulling-down control module;

the dual pulling-down module is connected with the dual pulling-down control module, the output signal terminal at present stage and the gate of the first thin film transistor, respectively, and is used for pulling down the output signal at present stage and the potential at the gate of the first thin film transistor alternatively under a control of the dual pulling-down control module; wherein the precharging and resetting unit comprises a second thin film transistor and a third thin film transistor;

the dual pulling-down module comprises a fourth thin film transistor, a fifth thin film transistor and a sixth thin film transistor;

the dual pulling-down control module comprises an inverter including a seventh thin film transistor, an eighth thin film transistor, a ninth thin film transistor and a tenth thin film transistor;

the dual pulling-down control module is connected with a first clock signal input terminal, and the dual pulling-down module is connected with a second clock signal input terminal;

a gate of the fourth thin film transistor is connected with a gate of the fifth thin film transistor, a drain of the eighth thin film transistor and a source of the tenth thin film transistor, respectively, a source thereof is connected with a power supply VSS, and a drain thereof is connected with the gate of the first thin film transistor, a gate of the seventh thin film transistor, the source of the second thin film transistor and the drain of the third thin film transistor, respectively;

a source of the fifth thin film transistor is connected with the power supply VSS, and a drain thereof is connected with the output signal terminal at present stage;

a gate of the sixth thin film transistor is connected with the second clock signal input terminal, and a drain thereof is connected with the output signal terminal at present stage;

a gate of the seventh thin film transistor is connected with the gate of the first thin film transistor, a source thereof is connected with the power supply VSS, and a drain thereof is connected with a source of the ninth thin film transistor and a gate of the tenth thin film transistor, respectively;

a gate of the eighth thin film transistor is connected with the gate of the first thin film transistor, a source thereof is connected with the power supply VSS, and a drain thereof is connected with a source of the tenth thin film transistor;

a gate and a drain of the ninth thin film transistor are connected with the first clock signal input terminal, and a source thereof is connected with a gate of the tenth thin film transistor; and a drain of the tenth thin film transistor is connected with the first clock signal input terminal.

2. The shift register of claim 1, wherein, a drain of the first thin film transistor is connected with the first clock signal input terminal, the source thereof is connected with the output signal terminal at present stage, and the gate thereof is connected with the scan signal input terminal via the precharging and resetting unit;

a gate of the second thin film transistor is connected with the input terminal connected to the output signal at previous stage, a drain thereof is connected with the scan control signal input terminal, and a source thereof is connected with the gate of the first thin film transistor;

a gate of the third thin film transistor is connected with the input terminal connected to the output signal at next stage, a drain thereof is connected with the gate of the first thin film transistor, and a source thereof is connected with the scan control signal input terminal.

3. The shift register of claim 1, further comprising a pulling-down and resetting unit;

the pulling-down and resetting unit is connected with the input terminal connected to the output signal of the shift register at previous stage and the input terminal connected to the output signal of the shift register at next stage, respectively, and is used for pulling down and resetting the output signal at present stage under controls of the output signal of the shift register at previous stage and the output signal of the shift register at next stage.

4. The shift register of claim 3, wherein, the pulling-down and resetting unit comprises an eleventh thin film transistor and a twelfth thin film transistor;

a source of the eleventh thin film transistor is connected with the power supply VSS, a drain thereof is connected with the output signal terminal at present stage, and a gate thereof is connected with the input terminal connected to the output signal of the shift register at next stage;

a source of the twelfth thin film transistor is connected with the power supply VSS, a drain thereof is connected with the output signal terminal at present stage, and a gate thereof is connected with the input terminal connected to the output signal of the shift register at previous stage;

the eleventh thin film transistor pulls down the output signal at present stage when the output signal of the shift register at next stage is at a high level; and the twelfth thin film transistor pulls down the output signal at present stage when the output signal of the shift register at previous stage is at a high level.

5. A driving method applied to the shift register of claim 1, comprising:

a precharging step: precharging a pulling-up capacitor included in a pulling-up unit by a precharging and resetting unit, so that a first thin film transistor included in the pulling-up unit is turned on;

a pulling-up step: pulling up an output signal of the shift register at present stage by the pulling-up unit, so that the output signal of the shift register at present stage is at a high level;

a resetting step: resetting a potential at a gate of the first thin film transistor by the precharging and resetting unit, so that the output signal at present stage is at a low level; and a pulling-down step: pulling down the potential at the gate of the first thin film transistor and the output signal at present stage, so that the pulling-up unit is turned off and the output signal at present stage is at a low level.

6. A gate driving apparatus comprising a plurality of stages of shift registers, of claim 1, manufactured on an array substrate of a liquid crystal display by an array film process; wherein except the shift register at a first stage, an input terminal of each of the remaining shift registers, which is connected to an output signal of a shift register at previous stage, is connected with an output signal terminal of a shift register at previous stage adjacent to the present shift register;

except the shift register in a last stage, an input terminal of each of the remaining shift registers, which is connected to an output signal of a shift register at next stage, is connected with an output signal terminal of a shift register at next stage adjacent to the present shift register; and both of an input terminal of the shift register at the first stage, which is connected to an output signal of a shift register at previous stage, and an input terminal of the shift register at the last stage, which is connected to an output signal of a shift register at next stage, are connected with a start signal.

7. The gate driving apparatus of claim 6, wherein a scan control signal input terminal of the shift register at the (2M-1)th stage and a scan control signal input terminal of the shift register at the 2Mth stage are connected with a STV, when M is an odd number; the scan control signal input terminal of the shift register at the (2M-1)th stage and the scan control signal input terminal of the shift register at the 2Mth stage are connected with a STVB, when M is an even number; wherein M is a positive integer being smaller than or equal to a value obtained by dividing the number of the shift registers by 2; and the STV and the STVB are dual cycle complementary clock signals.

* * * * *